United States Patent [19]

Yoshisato

[11] Patent Number: 4,479,091
[45] Date of Patent: Oct. 23, 1984

[54] PHASE LOCKED LOOP FM DEMODULATOR WITH VARIABLE BANDWIDTH LOOP FILTER

[75] Inventor: Akiyuki Yoshisato, Soma, Japan

[73] Assignee: Alps Electric Co., Ltd., Tokyo, Japan

[21] Appl. No.: 326,946

[22] Filed: Dec. 3, 1981

[30] Foreign Application Priority Data

Dec. 3, 1980 [JP] Japan .................. 55-169472

[51] Int. Cl.³ .................... H03D 3/00; H03L 7/08
[52] U.S. Cl. ........................ 329/122; 329/50;
331/17; 331/23; 455/266
[58] Field of Search ............ 329/50, 122, 110;
331/17, 23; 455/260, 263, 266, 312

[56] References Cited

U.S. PATENT DOCUMENTS

| | | |
|---|---|---|
| 3,911,232 | 10/1975 | Itoh .................. 329/122 X |
| 4,009,450 | 2/1977 | Holcomb et al. . |
| 4,077,015 | 2/1978 | Carson et al. .......... 331/17 X |
| 4,121,170 | 10/1978 | Hartmann et al. ....... 331/17 X |
| 4,123,718 | 10/1978 | Lampert et al. . |
| 4,433,308 | 2/1984 | Hirata .................. 331/17 |

FOREIGN PATENT DOCUMENTS

| | | | |
|---|---|---|---|
| 56-16328 | 2/1981 | Japan .................. | 331/17 |
| 56-117429 | 9/1981 | Japan .................. | 331/17 |

Primary Examiner—Siegfried H. Grimm
Assistant Examiner—W. R. Paxman
Attorney, Agent, or Firm—Guy W. Shoup; Gerard F. Dunne

[57] ABSTRACT

In an FM demodulation circuit which demodulates an FM signal by the use of a phase-lock loop constructed of a phase comparator, a loop filter and a voltage-controlled oscillator, the loop filter is a variable loop filter whose loop band width is varied in correspondence with the modulation band width and the carrier/noise ratio of the input signal by a base band processing circuit.

4 Claims, 8 Drawing Figures

4,479,091

PHASE LOCKED LOOP FM DEMODULATOR WITH VARIABLE BANDWIDTH LOOP FILTER

BACKGROUND OF THE INVENTION

The present invention relates to an FM demodulation circuit. More particularly, it relates to an FM demodulation circuit employing a phase locked loop (PLL) wherein the loop filter of the PLL is constructed as a variable loop filter, the loop band width of which is varied in correspondence with the magnitude of the carrier to noise ratio (C/N), and the degree of modulation and modulation frequency of an input signal.

A known FM demodulation circuit employing of PLL will be described with reference to FIGS. 1 to 3. Such a circuit has been used in the reception of signals from a satellite and, as shown in FIG. 1, a down link signal from a satellite is converted into a signal of an intermediate frequency (IF) in, for example, the 70 MHz band by a frequency converter circuit not shown. The intermediate frequency signal is controlled to an optimum level by an intermediate frequency amplifier circuit and an automatic gain control circuit (AGC) not shown, and is applied to a phase comparator 1 of the PLL demodulation circuit at the succeeding stage. The phase comparator 1 compares the phase of the intermediate frequency input signal and the phase of a signal from a voltage-controlled oscillator 2. An output from the phase comparator 1 generated on the basis of the difference of the phase between the two compared signals is smoothed by a loop filter 3. The output from the loop filter 3 functions as a control voltage for the voltage-controlled oscillator 2, to bring the frequency of the controlled oscillator 2 into exact agreement with the frequency of the intermediate frequency input signal. The output signal of the loop filter 3 (the control voltage to the voltage-controlled oscillator 2) is a signal obtained by demodulating an IF signal which is frequency modulated by a base band signal. After the demodulated IF or recovered base band signal is amplified by an amplifier 4, it is subjected to a deemphasis circuit 5 for adjustment by the attenuation of a higher frequency regions of the transmitted signal made by an emphasis circuit in the transmitter. A part of the corrected signal is transmitted to an audio demodulation circuit, not shown, in order to demodulate the audio signal, while the other part thereof is transmitted to a clamp circuit and a video amplifier, not shown, through a low-pass filter 6 adapted to pass the video signal band.

FIG. 2 shows the discrete circuit components of a lag-lead filter which is usually used as the loop filter 3 in FIG. 1. In FIG. 2, numerals 7 and 9 designate resistors, and numeral 8 a capacitor.

In general, factors which determine the characteristics of the PLL are the D.C. loop gain, and the loop band width of the loop filter. It is known that the D.C. loop gain is determined by the product between the conversion gain $K_1$ of the phase comparator 1 and the voltage-to-frequency conversion gain $K_2$ of the voltage-controlled oscillator 2. One the other hand, the loop band width of the loop filter is determined by the time constants $\tau_1$ and $\tau_2$ of the filter. In case of the lag-lead filter shown in FIG. 2, these time constants $\tau_1$ and $\tau_2$ are expressed by:

$$\begin{cases} \tau_1 = C_1 R_1 \\ \tau_2 = C_1 R_2 \end{cases}$$

Assuming here that the D.C. loop gain is constant, the characteristics of the PLL constructed of the phase comparator 1, voltage-controlled oscillator 2 and loop filter 3 (the lag-lead filter shown in FIG. 2), in other words, the characteristics of the FM demodulation circuit employing the PLL, are determined by the selection of the time constants $\tau_1$ and $\tau_2$ determining the loop band width. Thus, the transient response characteristics of the capture range, the noise band width, the maximum phase deviation, the maximum frequency etc. are determined. In the case of the lag-lead filter 3 in FIG. 2:

$$\text{Natural frequency of loop, } \omega_n = \left( \frac{K_1 \times K_2}{\tau_1 + \tau_2} \right)^{\frac{1}{2}}$$

$$\text{Damping coefficient, } \rho = \frac{\omega_n}{2} \cdot \exp\left( \tau_2 + \frac{1}{K_1 \times K_2} \right)$$

Since $\tau_1 \gg \tau_2$ is selected in most cases, the natural frequency $\omega_n$ of the loop is substantially determined by the time constant $\tau_1$ or $C_1$ as well as $R_1$. It can be said that the loop band width is also determined by $C_1$ as well as $R_1$ in this way.

FIG. 3 shows the filter characteristic of the lag-lead filter 3. It illustrates that the loop band width is substantially constant at $\omega_n$ irrespective of the modulation band width of the input signal.

Among the characteristics of the FM demodulation circuit employing the PLL, there is the tracking characteristic. In order to attain a good tracking characteristic by minimizing a transient error for the modulated wave of the input signal and reducing the jitter of an output attributed to the internal noise of the voltage-controlled oscillator 2, the state must be held in which the loop band width can be made sufficiently broad versus the required modulation band width of the input signal. In contrast, in order to reduce the jitter of the output generated by an external noise in the case where the C/N ratio of the input signal is inferior, the loop band width needs to be narrowed to the utmost. In this manner, filter constants for attaining good tracking characteristic and performing a demodulation of little distortion, and filter constants for suppressing to a small magnitude the noise of the output in the case of the inferior C/N ratio involve contrary design considerations. In the known FM demodulation circuit employing the PLL as shown in FIG. 1, both design considerations cannot be simultaneously fulfilled, and filter constants which afford the optimum condition comprehensively are selected in design. It has been impossible to simultaneously select the optimum value for each characteristic.

SUMMARY OF THE INVENTION

The present invention has been made in order to eliminate the disadvantage described above, and has for its object to provide an FM demodulation circuit which can attain a good tracking characteristic and which can simultaneously suppress the noise of the output signal in the case of an inferior C/N ratio.

The disadvantage of the known circuit is due to the fact that the filter constants are fixed. According to the present invention, the filter constants are made variable so as to create one loop band width for good tracking characteristic and another loop band width for suppression of noise.

PREFERRED EMBODIMENTS OF THE INVENTION

Hereunder, the present invention will be described with reference to FIGS. 4 to 8.

Figure 1:
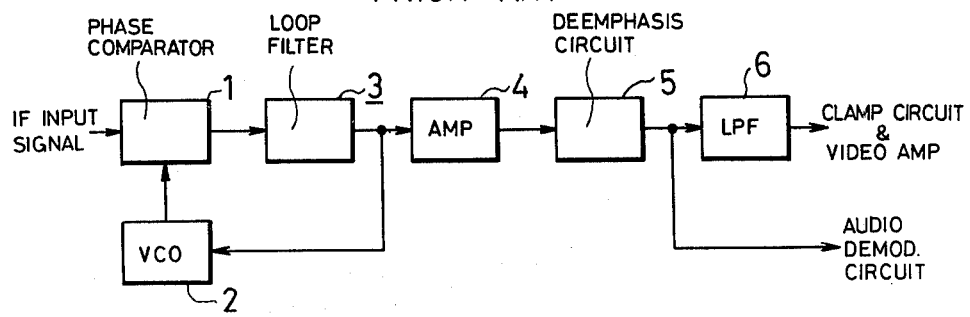
FIG. 1 is a block diagram showing an example of a known FM demodulation circuit employing a PLL.
Figure 2:
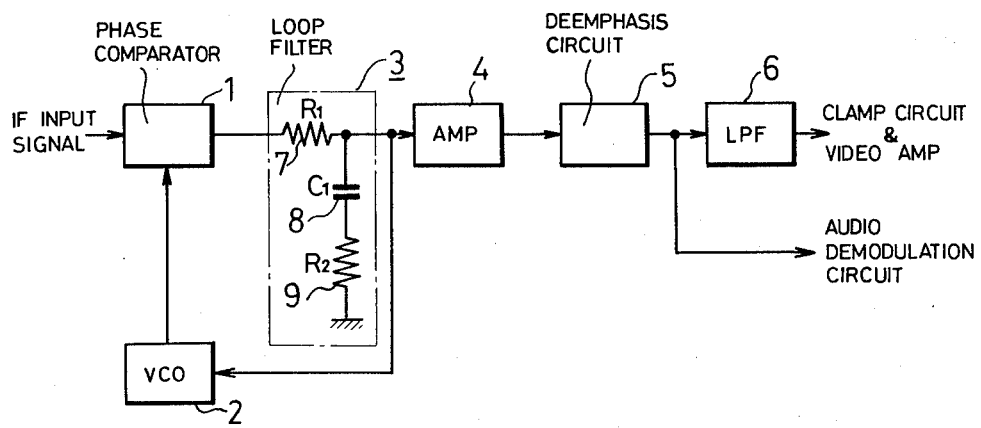
FIG. 2 is a diagram showing the circuit arrangement of an example of a loop filter used in the FM demodulation circuit of FIG. 1.
Figure 3:
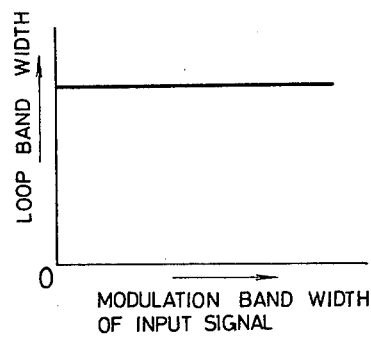
FIG. 3 is a graph showing a "modulation band width of an input signal"—"loop band width" characteristic of the FM demodulation circuit shown in FIG. 1.
Figure 4:
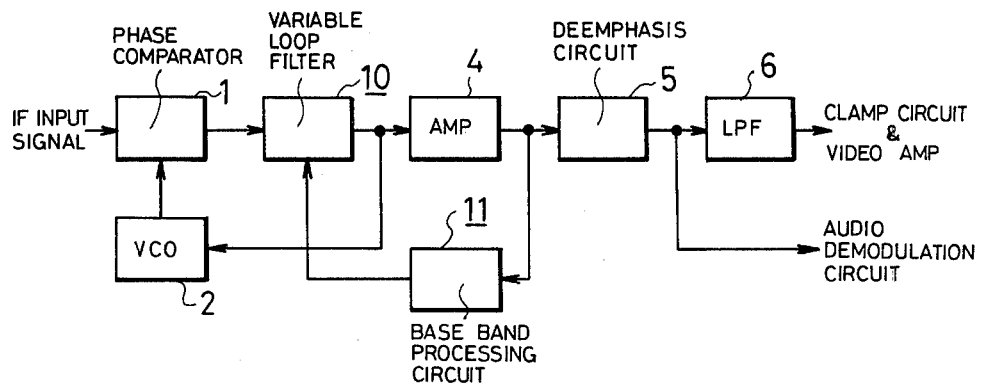
FIG. 4 is a block diagram showing an embodiment of an FM demodulation circuit according to the present invention.

In the circuit arrangement of an embodiment of an FM demodulation circuit according to the present invention shown in FIG. 4, numerals 1, 2 and 4 to 6 correspond to those in FIG. 1, and numeral 10 indicates a variable loop filter and numeral 11 a base band processing circuit.

The loop band width of the variable loop filter 10 is changed by making the filter constants of the variable loop filter 10 variable. The filter constants are varied by a control voltage from the base band processing circuit 11. The control voltage is obtained in such a way that a recovered base band signal from the variable loop filter 10 is amplified by the amplifier 4 and is thereafter processed by the base band processing circuit 11.

Figure 5:
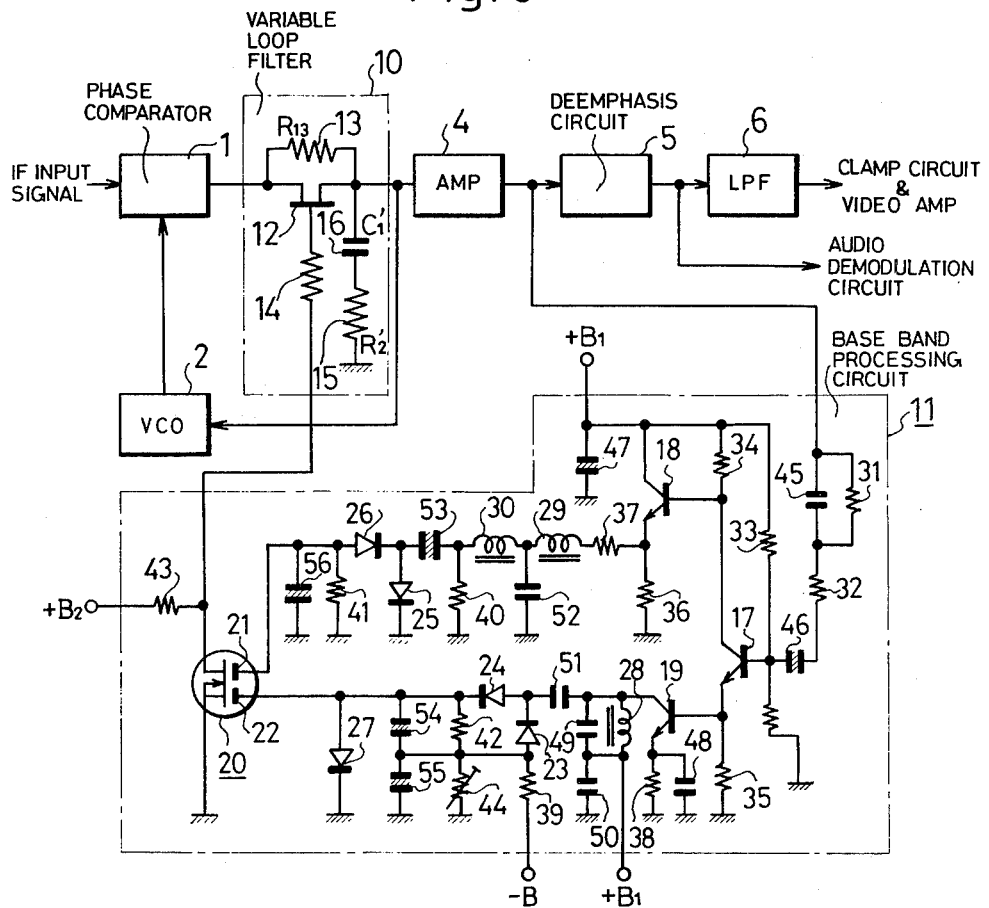
FIG. 5 is a diagram showing the circuit arrangements of embodiments of a variable loop filter and a base band processing circuit in the FM demodulation circuit of FIG. 4.

The circuit arrangement of an embodiment of the variable loop filter 10 and of the base band processing circuit 11 is shown in FIG. 5. In the figure, numerals 1, 2 and 4 to 6 correspond to those in FIG. 1, and numerals 10 and 11 correspond to those in FIG. 4. Numeral 12 indicates an FET (field-effect transistor), numerals 13 to 15 resistors, and numeral 16 a capacitor. Numerals 17 to 19 indicate transistors, numeral 20 a dual gate FET having a first gate 21 and a second gate 22, numerals 23 to 27 diodes, numerals 28 to 30 coils, numerals 31 to 43 resistors, numeral 44 a variable resistor, and numerals 45 to 56 capacitors.

Since the FET 12 is controlled by the control voltage from the base band processing circuit 11 through the resistor 14, it can be considered as a variable resistor $R_{FET}$. As the variable resistor $R_{FET}$ is connected in parallel with the resistor 13, their combined resistance $R_1'$ is represented as follows:

$$R_1' = \frac{R_{13} \times R_{FET}}{R_{13} + R_{FET}} \quad (1)$$

Accordingly, the time constants of the variable loop filter 10 constructing a lag-lead filter become:

$$\begin{cases} \tau_1 = R_1' \times C_1' = \frac{R_{13} \times R_{FET}}{R_{13} + R_{FET}} \times C_1' & (2) \\ \tau_2 = R_2' \times C_1' & (3) \end{cases}$$

Figure 6:
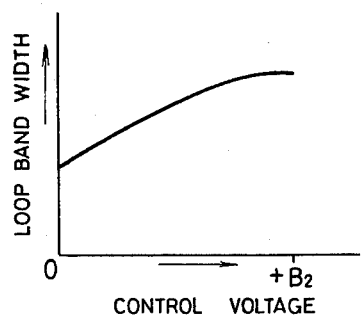
FIG. 6 is a graph showing a "control voltage"—"loop band width" characteristic curve of the variable loop filter for use in the FM demodulation circuit according to the present invention.

Depending upon the control voltage from the base band processing circuit 11 applied to the gate of the FET 12, the operating state of the FET 12 changes, and accordingly, its equivalent resistance $R_{FET}$ changes. The magnitude $\tau_1/C_1'$ of Expression (2) is the smallest when the FET 12 is in the "on" state. It changes in a range of values from an equivalent resistance at that time to the maximum value corresponding to the "off" state of the FET 12, that is, to the resistance $R_{13}$ of the resistor 13. The situation of the variation of the loop band width of the variable loop filter 10 in this case is shown in FIG. 6 illustrative of the "control voltage'—"loop band width" characteristic curve of the variable loop filter used in the FM demodulation circuit according to the present invention. As the control voltage applied to the FET 12 increases, the loop band width expands.

Now, there will be described the generation of the control voltage which gives rise to the variation of the loop band width shown in FIG. 6.

Referring to FIG. 5, a base band signal sampled from the amplifier 4 and proportional to the modulation degree of an intermediate frequency signal has its higher frequency region emphasized by a parallel circuit consisting of the capacitor 45 and the resistor 31 and by the resistor 32. The resultant signal is applied to the transistor 17 through the capacitor 46. An output from the collector of the transistor 17 is applied to transistor 18 in an emitter follower configuration at the succeeding stage. The transistor 18 provides a signal proportional to the modulation degree and the modulation frequency of the intermediate frequency signal across the resistor 36. This signal across the resistor 36 is applied to a low-pass filter which consists of the coils 29 and 30 and the capacitor 52. The resistors 37 and 40 are matching resistors of the low-pass filter. Owing to the low-pass filter, noise having frequency components higher than the maximum modulation frequency of the FM demodulator are eliminated, and only a signal component is passed through the capacitor 53 and is converted into a D.C. voltage by the diodes 25 and 26. The D.C. voltage is applied to the first gate 21 of the dual gate FET 20.

On the other hand, a signal is supplied from the emitter of the transistor 17 to the transistor 19, and is sent to a tuning circuit consisting of the coil 28 and the capacitor 49, and it is tuned and amplified to a frequency higher than the maximum modulation frequency of the FM demodulation circuit and not affected by the modulation degree or the modulating signal, for example, about 10 MHz. Thus, a signal proportional to external noise is derived. This signal proportional to the external noise is converted into a D.C. voltage by the diodes 23 and 24, and the D.C. voltage is applied to the second gate 22 of the dual gate FET 20. In the absence of any external noise, in other words, at a great C/N ratio, a negative D.C. voltage $-B$ applied to the resistor 39 is divided by the resistor 39 and the variable resistor 44, and the divided negative voltage is applied to the second gate 22 of the dual gate FET 20, so that the dual gate FET 20 is in the "off" state. The variable resistor 44 is a resistor for adjusting the negative voltage to be applied to the second gate 22, and is set at a predetermined voltage level. The diode 27 is a limiter diode for preventing a positive D.C. voltage, produced by the diodes 23 and 24 due to an external noise, signal from being superposed on the negative voltage produced by the negative D.C. voltage $-B$ applied to the resistor 39 and for preventing any excess positive voltage from being applied to the second gate 22 of the dual gate FET 20.

In the base band processing circuit 11, when the C/N ratio is great, any positive voltage due to the external noise does not appear at the cathode of the diode 23 as explained above. Accordingly, a deep negative voltage is applied to the second gate 22 of the dual gate FET 20 by the negative D.C. voltage $-B$. Therefore, the dual gate FET 20 falls into the "off" state irrespective of the signal applied to the first gate 21, and a D.C. voltage $+B_2$ is provided as the control voltage from the base band processing circuit 11 to the variable loop filter 10.

In contrast, when the C/N ratio is small, a positive voltage which is generated at the cathode of the diode 24 due to the external noise is superposed on the negative voltage based on the negative voltage $-B$, and the gate voltage which is applied to the second gate 22 of the dual gate FET 20 shifts from a negative bias toward the null voltage. Therefore, the drain voltage of the dual gate FET 20 is changed by the gate voltage applied to the first gate 21. In the case where the modulation degree and the modulation frequency of the input signal are small and where the C/N ratio is small, a negative D.C. voltage which develops at the anode of the diode 26 becomes small. Therefore, both the gate voltages which are applied to the first gate 21 and the second gate 22 of the dual gate FET 20 shift from negative biases toward the null voltage, and the dual gate FET 20 changes toward the "on" state. Accordingly, the control voltage from the base band processing circuit 11 to the variable loop filter 10 undergoes a change coming close to the null voltage. In addition, in the case where the modulation band width of the input signal is great and where the C/N ratio is small, the negative voltage which develops at the anode of the diode 26 goes more negative, so that the dual gate FET 20 is brought into the "off" state irrespective of the gate voltage applied to the second gate 22, by the negative voltage applied to the first gate 21 of the dual gate FET 20 connected with the anode of the diode 26. Thus, the voltage $+B_2$ is delivered as the control voltage from the base band processing circuit 11 to the variable loop filter 10.

Figure 7:
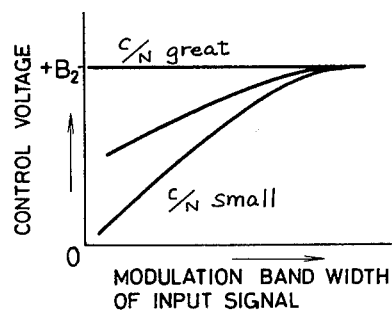
FIG. 7 is a graph showing "modulation band width of an input signal"—"control voltage" characteristic curves of the base band processing circuit for use in the FM demodulation circuit according to the present invention.

FIG. 7 shows the relationships between the modulation band width of the input signal and the control voltage with the C/N ratio being a parameter.

Figure 8:
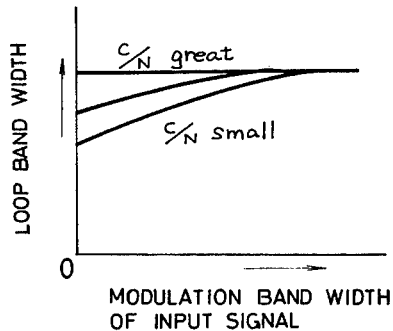
FIG. 8 is a graph showing "modulation band width of an input signal"—"loop band width" characteristic curves of the FM demodulation circuit according to the present invention.

Since the control voltage as shown in FIG. 7 is transmitted from the base band processing circuit 11 toward the FET 12 of the variable loop filter 10, the characteristics of the loop band width versus the modulation band width of the input signal, of the variable loop filter 10 having the characteristic illustrated in FIG. 6 become as shown in FIG. 8. More specifically, the loop band width versus the modulation band width of the input signal becomes variable depending upon the magnitude of the C/N ratio. For example, in the case where the C/N ratio is great, the variable loop filter 10 comes to have a loop band width broad enough to meet the modulation band width of the input signal, so that a demodulation of small distortion is performed. In the case where the C/N ratio is small and where the modulation band width of the input signal is small, the loop band width is narrowed to one meeting this modulation band width, and an output jitter developing due to an external noise can be diminished.

As set forth above, according to the present invention, the loop band width of a loop filter is varied in correspondence with the modulation band width of an input signal and the C/N ratio of the input signal. Thus, an FM demodulation circuit becomes possible which operates to broaden the loop band width in order to execute a demodulation of little distortion in the case of a great C/N ratio and operates to narrow the loop band width to one corresponding to the modulation band width of the input signal in order to reduce a demodulated noise ascribable to an external noise in the case of a small C/N ratio and which accordingly satisfies both the function of demodulating the input signal with little distortion and the function of reducing the demodulated noise ascribable to the external noise.

I claim:

1. An FM demodulation circuit which demodulates an FM signal by the use of a PLL, comprising:
    a phase comparator for receiving the signal to be demodulated,
    a variable loop filter having a variable band width and connected to receive the output of said phase comparator,
    means including a voltage-controlled oscillator receiving the signal from said variable loop filter for producing a control signal for said phase comparator,
    means including a base band processing circuit for detecting a signal component and a noise component having a frequency higher than a maximum modulation frequency of said signal from said variable loop filter and providing an output signal for controlling the loop band width of said variable loop filter in correspondence with the magnitudes of said signal component and said noise component.

2. An FM demodulation circuit according to claim 1, said variable loop filter being provided with a field-effect transistor connected between the input and output thereof and having one gate supplied with said output signal from said base band processing circuit.

3. An FM demodulation circuit according to claim 1, said loop band width of said variable loop filter being broadened when said noise component is not less than a preset level and said signal component is relatively large; said loop band width of said variable loop filter being narrowed when said signal component is relatively small; and said loop band width of said variable loop filter being maximized when said noise component is less than said preset level.

4. A FM demodulation circuit according to claim 1, said base band processing circuit including a dual gate field-effect transistor having one gate supplied with said signal component and the other gate with said noise component, and the drain of said dual gate field-effect transistor being connected to a power supply through a resistor, said output signal being provided from said drain.

* * * * *